US008976540B2

(12) United States Patent
Yoo

(10) Patent No.: US 8,976,540 B2
(45) Date of Patent: Mar. 10, 2015

(54) MOBILE TERMINAL

(75) Inventor: Mansung Yoo, Seoul (KR)

(73) Assignee: LG Electronics Inc., Seoul (KR)

( * ) Notice: Subject to any disclaimer, the term of this patent is extended or adjusted under 35 U.S.C. 154(b) by 481 days.

(21) Appl. No.: 13/356,225

(22) Filed: Jan. 23, 2012

(65) Prior Publication Data

US 2013/0016484 A1 Jan. 17, 2013

(30) Foreign Application Priority Data

Jul. 13, 2011 (KR) ........................ 10-2011-0069615

(51) Int. Cl.
*H05K 9/00* (2006.01)

(52) U.S. Cl.
CPC .................................... *H05K 9/0028* (2013.01)
USPC ........... 361/818; 361/816; 361/800; 361/752; 174/350; 174/394; 455/301; 455/575.5

(58) Field of Classification Search
CPC . H05K 1/0213; H05K 1/0224; H05K 9/0024; H05K 9/0033; H05K 9/0026; H01Q 1/245
USPC ......... 174/350, 394, 392, 371, 358, 377, 373, 174/387; 361/816, 818, 749; 455/301, 455/575.5
See application file for complete search history.

(56) References Cited

U.S. PATENT DOCUMENTS

| | | | | |
|---|---|---|---|---|
| 4,370,700 A | * | 1/1983 | Duddles et al. | 361/818 |
| 5,014,160 A | * | 5/1991 | McCoy, Jr. | 361/818 |
| 5,159,537 A | * | 10/1992 | Okano | 361/816 |
| 5,438,482 A | * | 8/1995 | Nakamura et al. | 361/816 |
| 5,519,578 A | * | 5/1996 | Fujii | 361/749 |
| 5,525,953 A | * | 6/1996 | Okada et al. | 333/204 |
| 5,740,527 A | | 4/1998 | Mitama | |
| 5,777,856 A | * | 7/1998 | Phillips et al. | 361/816 |
| 5,867,371 A | * | 2/1999 | Denzene et al. | 361/816 |
| 6,031,494 A | * | 2/2000 | Okabe et al. | 343/702 |
| 6,304,458 B1 | * | 10/2001 | Mendolia | 361/814 |
| 6,624,432 B1 | * | 9/2003 | Gabower et al. | 250/515.1 |
| 7,177,161 B2 | * | 2/2007 | Shima | 361/816 |

(Continued)

FOREIGN PATENT DOCUMENTS

| | | |
|---|---|---|
| JP | 5-102635 A | 4/1993 |
| JP | 8-148878 A | 6/1996 |

(Continued)

*Primary Examiner* — Adrian S Wilson
*Assistant Examiner* — Abhishek Rathod
(74) *Attorney, Agent, or Firm* — Birch, Stewart, Kolasch & Birch, LLP

(57) ABSTRACT

A mobile terminal includes a terminal body; and a printed circuit board (PCB) assembly mounted to the terminal body. The PCB assembly includes a first PCB, a first electronic device mounted on the first PCB, a second PCB spaced from the first PCB in a first direction, a second electronic device mounted on the second PCB. The first electronic device is disposed to overlap the second electronic device in the first direction. A first shield can may be mounted on the first PCB so as to cover the first electronic device, and configured to shield Electro Magnetic Interference (EMI) between the first electronic device and the outside. A shield block may be disposed at a space between the first and second PCBs, accommodating therein the first and second electronic devices, and shielding EMI between the first electronic device and the outside, and between the second electronic device and the outside.

6 Claims, 6 Drawing Sheets

(56) References Cited

U.S. PATENT DOCUMENTS

| | | |
|---|---|---|
| 7,365,992 B2 * | 4/2008 | Lee ................. 361/800 |
| 7,952,881 B2 * | 5/2011 | Magana et al. ........... 361/719 |
| 7,999,196 B2 * | 8/2011 | Hsieh ................. 174/386 |
| 2005/0162841 A1 * | 7/2005 | Ogatsu ................. 361/816 |
| 2007/0153491 A1 | 7/2007 | Lee |
| 2007/0178763 A1 * | 8/2007 | Yang et al. ............ 439/607 |
| 2007/0211445 A1 * | 9/2007 | Robinson et al. ........ 361/818 |
| 2010/0319981 A1 * | 12/2010 | Kapusta et al. ......... 174/350 |
| 2011/0085316 A1 * | 4/2011 | Myers et al. ........... 361/818 |

FOREIGN PATENT DOCUMENTS

| | | |
|---|---|---|
| JP | 9-167895 A | 6/1997 |
| JP | 2002-51131 A | 2/2002 |
| JP | 2008-160534 A | 7/2008 |
| JP | 2009-81400 A | 4/2009 |
| JP | 2011-501477 A | 1/2011 |
| JP | 2011-71827 A | 4/2011 |
| JP | 2011-100891 A | 5/2011 |
| WO | WO 2009/057855 A1 | 5/2009 |

\* cited by examiner

MOBILE TERMINAL

CROSS-REFERENCE TO RELATED APPLICATION

Pursuant to 35 U.S.C. §119(a), this application claims the benefit of earlier filing date and right of priority to Korean Application No. 10-2011-0069615, filed on Jul. 13, 2011, the contents of which are incorporated by reference herein in their entirety.

BACKGROUND OF THE INVENTION

1. Field of the Invention

The present invention relates to a printed circuit board (PCB) assembly having a PCB and electronic devices, and a mobile terminal having the same.

2. Discussion of the Background Art

A mobile terminal indicates a portable electronic device having at least one of a voice/video call function, an information input/output function, a data storage function, etc.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

Various attempts have been made to implement complicated functions in such a multimedia device by means of hardware or software.

A printed circuit board (PCB) having electronic devices mounted thereon makes a PCB assembly. For a slim configuration of the mobile terminal, the PCB assembly has to be small through the integration of the electronic devices. In order to enhance hardware functions, the PCB assembly may require structural changes and improvements.

SUMMARY OF THE INVENTION

Therefore, an object of the invention is to provide a printed circuit board (PCB) assembly of high intensity capable of integrating electronic devices with each other.

Another object of the invention is to provide a mobile terminal having a slim configuration by maximizing space to mount electronic devices in a PCB assembly.

To achieve these and other advantages and in accordance with the purpose of this specification, as embodied and broadly described herein, a mobile terminal comprises: a terminal body; and a printed circuit board (PCB) assembly mounted to the terminal body, and forming a space where each type of electronic devices are arranged, wherein the PCB assembly comprises a first PCB where a first electronic device is mounted, and a second PCB disposed to face the first electronic device, and having a second electronic device mounted on a surface facing the first PCB, wherein the first electronic device is disposed to overlap the second electronic device in a direction perpendicular to a thickness direction of the first electronic device at a space between the first and second PCBs.

The mobile terminal may further include a first shield can mounted on the first PCB so as to cover the first electronic device, and configured to shield Electro Magnetic Interference (EMI) between the first electronic device and the outside.

A third electronic device may be mounted on the first PCB so as to face the second electronic device. And, the first shield can may extend from a part covering the first electronic device, and may be formed to have stair-steps so as to cover the third electronic device.

The second electronic device may protrude toward the first PCB more than the part of the first shield can which covers the first electronic device.

A fourth electronic device may be mounted on the second PCB so as to face the first electronic device. And, the mobile terminal may further comprise a second shield can mounted on the second PCB so as to cover the second and fourth electronic devices, and configured to shield Electro Magnetic Interference (EMI) between the second electronic device and the outside, and between the fourth electronic device and the outside.

The second shield can may extend from a part covering the second electronic device, and may be formed to have stair-steps so as to cover the fourth electronic device. The first shield can and the second shield can may be spaced from each other by a predetermined gap.

The mobile terminal may further comprise a shield wall protruding from the second PCB toward the first PCB, covering the second electronic device, and configured to shield Electro Magnetic Interference (EMI) between the second electronic device and the outside. The shield wall may be configured to encompass side surfaces of the first shield can. The shield wall may be adjacent to an upper surface of the first shield can. The mobile terminal may further comprise a shield block disposed between the first and second PCBs, having cavities for accommodating therein the first and second electronic devices, and configured to shield Electro Magnetic Interference (EMI) between the first and second electronic devices and the outside. The mobile terminal may further comprise a shield layer disposed in the cavities to separate regions of the first and second electronic devices from each other, and configured to shield Electro Magnetic Interference (EMI) between the first and second electronic devices.

The shield layer may include a first shield layer covering an upper surface of the first electronic device, a second shield layer covering an upper surface of the second electronic device and spaced from the first shield layer by a predetermined gap in a thickness direction of the first electronic device, and a third shield layer configured to connect the first and second shield layers to each other.

The shield block and the shield layer may be integrally formed with each other.

An elastic coupling portion disposed along a circumference of the shield block may be formed on the first PCB and configured to accommodate and elastically press the shield block so that the shield block may be fixed. The elastic coupling portion may be electrically connected to the first PCB so that the shield block may be grounded.

The mobile terminal may further comprise first and second antennas configured to transmit and receive electromagnetic waves for wireless communications, and be adjacent to the first and second electronic devices, respectively, in a state that the shield block is interposed therebetween.

According to another aspect of the present invention, a mobile terminal may comprise: a terminal body; and a printed circuit board (PCB) assembly mounted to the terminal body, and forming a space where each type of electronic devices are arranged, wherein the PCB assembly comprises: a first PCB where a first electronic device is mounted; a second PCB disposed to face the first electronic device, and having a second electronic device mounted on a surface facing the first PCB; and a shield block disposed at a space between the first and second PCBs, accommodating therein the first and second electronic devices, and configured to shield Electro Magnetic Interference (EMI) between the first electronic device and the outside, and between the second electronic device and the outside.

The mobile terminal may further comprise a shield layer disposed in the shield block to separate regions of the first and second electronic devices from each other, and configured to shield Electro Magnetic Interference (EMI) between the first and second electronic devices.

The shield layer may include a first shield layer covering an upper surface of the first electronic device, a second shield layer covering an upper surface of the second electronic device and spaced from the first shield layer by a predetermined gap in a thickness direction of the first electronic device, and a third shield layer configured to connect the first and second shield layers to each other.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate embodiments and together with the description serve to explain the principles of the invention.

In the drawings.

DETAILED DESCRIPTION OF THE INVENTION

Figure 1:
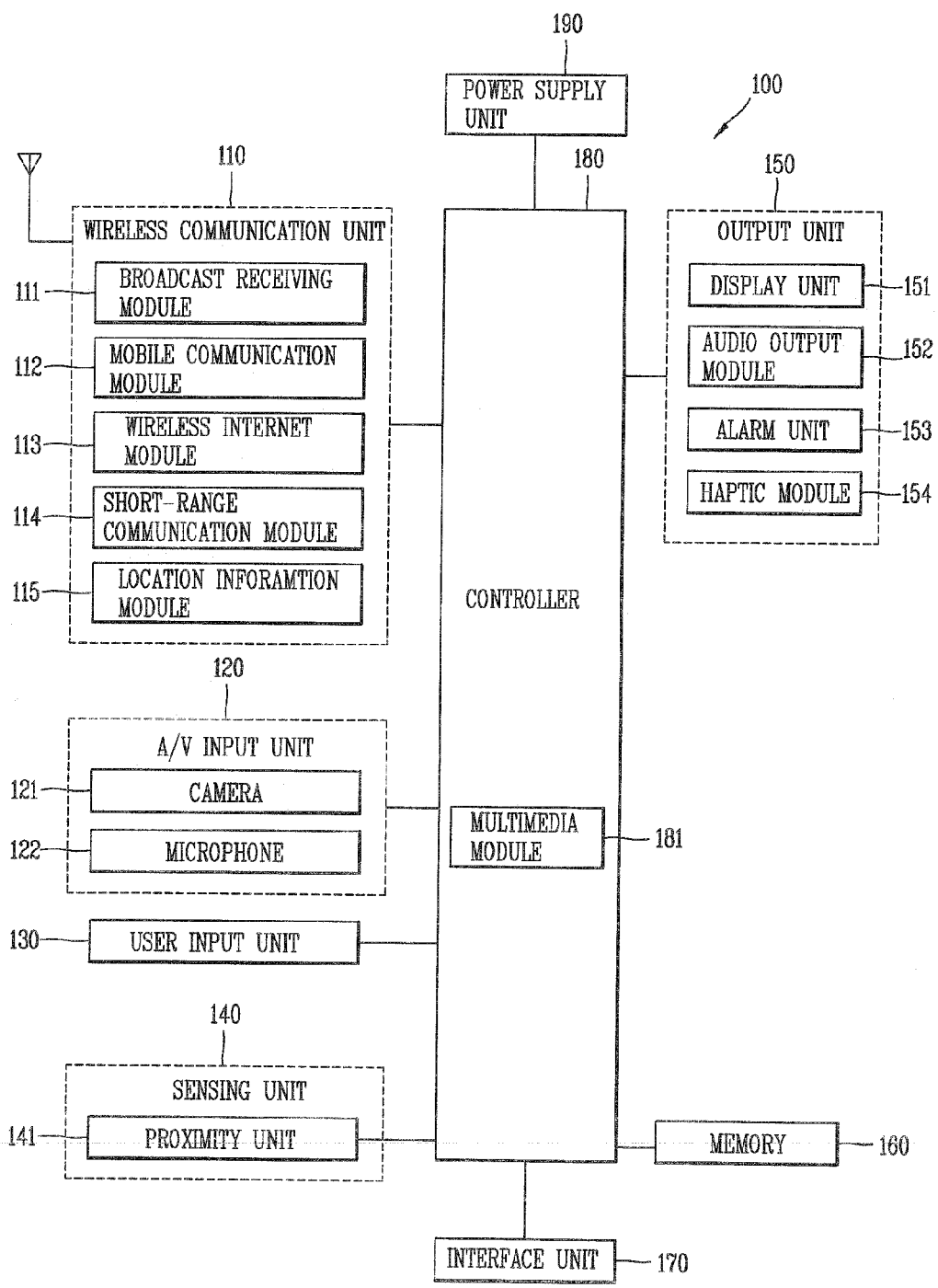
FIG. 1 is a block diagram of a mobile terminal according to one embodiment of the present invention.

Description will now be given in detail of the embodiments, with reference to the accompanying drawings. For the sake of brief description with reference to the drawings, the same or equivalent components will be provided with the same reference numbers, and description thereof will not be repeated.

Hereinafter, a mobile terminal according to the present disclosure will be explained in more detail with reference to the attached drawings The suffixes attached to components of the mobile terminal, such as 'module' and 'unit or portion' were used for facilitation of the detailed description of the present disclosure. Therefore, the suffixes do not have different meanings from each other. The same reference numerals will be given to the same components as those of the aforementioned embodiment, and their explanations will be omitted. The singular expression of the present disclosure may include a plural concept unless distinctively differently defined.

The mobile terminal according to the present disclosure may include a portable phone, a smart phone, a laptop computer, a digital broadcasting terminal, Personal Digital Assistants (PDA), Portable Multimedia Player (PMP), an E-book, a navigation system, etc.

FIG. 1 is a block diagram of a mobile terminal 100 according to one embodiment of the present disclosure.

The mobile terminal 100 may include components, such as a wireless communication unit 110, an Audio/Video (A/V) input unit 120, a user input unit 130, a sensing unit 140, an output module 150, a memory 160, an interface unit 170, a controller 180, a power supply unit 190 and the like. FIG. 1 shows the mobile terminal 100 having various components, but it is understood that implementing all of the illustrated components is not a requirement. Greater or fewer components may alternatively be implemented.

Hereinafter, each component is described in sequence.

The wireless communication unit 110 may typically include one or more components which permit wireless communications between the mobile terminal 100 and a wireless communication system or between the mobile terminal 100 and a network within which the mobile terminal 100 is located. For example, the wireless communication unit 110 may include a broadcast receiving module 111, a mobile communication module 112, a wireless internet module 113, a short-range communication module 114, a position information module 115 and the like.

The broadcast receiving module 111 receives a broadcast signal and/or broadcast associated information from an external broadcast managing entity via a broadcast channel.

The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast associated information may refer to information associated with a broadcast channel, a broadcast program or a broadcast service provider. The broadcast signal may include a TV broadcast signal, a radio broadcast signal, a data broadcast signal, and the like. Also, the broadcast signal may further include a broadcast signal combined with a TV or radio broadcast signal.

The broadcast associated information may also be provided via a mobile communication network and, in this case, the broadcast associated information may be received by the mobile communication module 112.

The broadcast signal may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO), integrated services digital broadcast-terrestrial (ISDB-T), etc.

The broadcast receiving module 111 may be configured to be suitable for every broadcast system providing a broadcast signal as well as the above-mentioned digital broadcast systems. Broadcast signals and/or broadcast-associated information received via the broadcast receiving module 111 may be stored in the memory 160.

The mobile communication module 112 transmits and/or receives radio signals to and/or from at least one of a base station, an external terminal and a server. Such radio signals may include a voice call signal, a video call signal or various types of data according to text and/or multimedia message transmission and/or reception.

The wireless Internet module 113 supports wireless Internet access for the mobile communication terminal. This module may be internally or externally coupled to the mobile terminal 100. Here, as the wireless Internet technique, a wireless local area network (WLAN), Wi-Fi, wireless broadband (WiBro), world interoperability for microwave access (WiMAX), high-speed downlink packet access (HSDPA), and the like, may be used.

The short-range communication module 114 is a module for supporting short-range communications. Some examples of short-range communication technology include Bluetooth™, Radio Frequency IDentification (RFID), Infrared Data Association (IrDA), Ultra-WideBand (UWB), ZigBee™, and the like.

The location information module 115 is a module for checking or acquiring a location (or position) of the mobile communication terminal. For example, the location information module 115 may include a GPS (Global Positioning System) module.

The A/V input unit 120 is configured to receive an audio or video signal. The A/V input unit 120 may include a camera 121 and a microphone 122. The camera 121 processes image data of still pictures or video acquired by an image capture device in a video capturing mode or an image-capturing mode. The processed image frames may be displayed on a display unit 151.

The image frames processed by the camera 121 may be stored in the memory 160 or transmitted via the wireless communication unit 110. Two or more cameras 121 may be provided according to the configuration of the mobile communication terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated in the course of receiving and transmitting audio signals.

The user input unit 130 may generate key input data from commands entered by a user to control various operations of the mobile communication terminal. The user input unit 130 allows the user to enter various types of information, and may include a keypad, a dome switch, a touch pad (e.g., a touch sensitive member that detects changes in resistance, pressure, capacitance, etc. due to being contacted) a jog wheel, a jog switch, and the like.

The sensing unit 140 detects a current status (or state) of the mobile terminal 100 such as an opened or closed state of the mobile terminal 100, a location of the mobile terminal 100, the presence or absence of user contact with the mobile terminal 100 (e.g., touch inputs), the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is opened or closed. In addition, the sensing unit 140 can detect whether or not the power supply unit 190 supplies power or whether or not the interface unit 170 is coupled with an external device. The sensing unit 140 may include a proximity sensor 141.

The output unit 150 is configured to provide outputs in a visual, audible, and/or tactile manner. The output unit 150 may include the display unit 151, an audio output module 152, an alarm unit 153, a haptic module 154, and the like.

The display unit 151 may display information processed in the mobile terminal 100. For example, when the mobile terminal 100 is in a phone call mode, the display unit 151 may display a User Interface (UI) or a Graphic User Interface (GUI) associated with a call or other communication (such as text messaging, multimedia file downloading, etc.). When the mobile terminal 100 is in a video call mode or image-capturing mode, the display unit 151 may display a captured image and/or received image, a UI or GUI that shows videos or images and functions related thereto, and the like. The display unit 151 may include at least one of a Liquid Crystal Display (LCD), a Thin Film Transistor-LCD (TFT-LCD), an Organic Light Emitting Diode (OLED) display, a flexible display, a three-dimensional (3D) display, or the like.

Some of these displays may be configured to be transparent so that the outside may be seen therethrough, which may be referred to as a transparent display. A representative example of the transparent display may include a Transparent Organic Light Emitting Diode (TOLED), and the like. The rear surface portion of the display unit 151 may also be implemented to be optically transparent. Under this configuration, a user can view an object positioned at a rear side of a body through a region occupied by the display unit 151 of the body.

The display unit 151 may be implemented in two or more in number according to a configured aspect of the mobile terminal 100. For instance, a plurality of displays may be arranged on one surface integrally or separately, or may be arranged on different surfaces.

Here, if the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touch pad, and the like.

The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also a touch pressure.

When touch inputs are sensed by the touch sensors, corresponding signals are transmitted to a touch controller (not shown). The touch controller processes the received signals, and then transmits corresponding data to the controller 180. Accordingly, the controller 180 may sense which region of the display unit 151 has been touched.

Referring to FIG. 1, a proximity sensor 141 may be arranged at an inner region of the mobile terminal covered by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may convert data received from the wireless communication unit 110 or stored in the memory 160 in a call signal reception mode, a call mode, a record mode, a voice recognition mode, a broadcast reception mode, and the like and output such data as sound audio. Also, the audio output module 152 may provide audible outputs related to a particular function performed by the mobile terminal 100 (e.g., a call signal reception sound, a message reception sound, etc.). The audio output module 152 may include a speaker, a buzzer, and so on.

The alarm unit 153 may provide outputs to inform about the occurrence of an event of the mobile terminal 100. Typical events may include call reception, message reception, key signal inputs, a touch input, etc. In addition to audio or video outputs, the alarm unit 153 may provide outputs in a different manner to inform about the occurrence of an event. The video signal or the audio signal may be output via the display unit 151 or the audio output module 152. Accordingly, the display unit 151 or the audio output module 152 may be classified as a part of the alarm unit 153.

The haptic module 154 generates various tactile effects which a user can feel. A representative example of the tactile effects generated by the haptic module 155 includes vibration. Vibration generated by the haptic module 155 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 160 may store a program for the processing and control of the controller 180. Alternatively, the memory 160 may temporarily store input/output data (e.g., phonebook data, messages, still images, video and the like). Also, the memory 160 may store data relating to various patterns of vibrations and audio output upon the touch input on the touch screen.

The memory 160 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-only Memory (EEPROM), Programmable Read-only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), a Universal Subscriber Identity Module (USIM), and the like. Also, the device having the identification module (hereinafter, referred to as 'identification device') may be implemented in a type of smart card. Hence, the identification device can be coupled to the mobile terminal 100 via a port.

Also, the interface unit 170 may serve as a path for power to be supplied from an external cradle to the mobile terminal 100 when the mobile terminal 100 is connected to the external cradle or as a path for transferring various command signals inputted from the cradle by a user to the mobile terminal 100. Such various command signals or power inputted from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component. The controller 180 can perform a pattern recognition processing so as to recognize writing or drawing input on the touch screen as text or image.

The power supply unit 190 serves to supply power to each component by receiving external power or internal power under control of the controller 180.

Various embodiments described herein may be implemented in a computer-readable medium using, for example, software, hardware, or some combination thereof.

For a hardware implementation, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, other electronic units designed to perform the functions described herein, or a selective combination thereof. In some cases, such embodiments are implemented by the controller 180.

For software implementation, the embodiments such as procedures and functions may be implemented together with separate software modules each of which performs at least one of functions and operations. The software codes can be implemented with a software application written in any suitable programming language. Also, the software codes may be stored in the memory 160 and executed by the controller 180.

Figure 2:
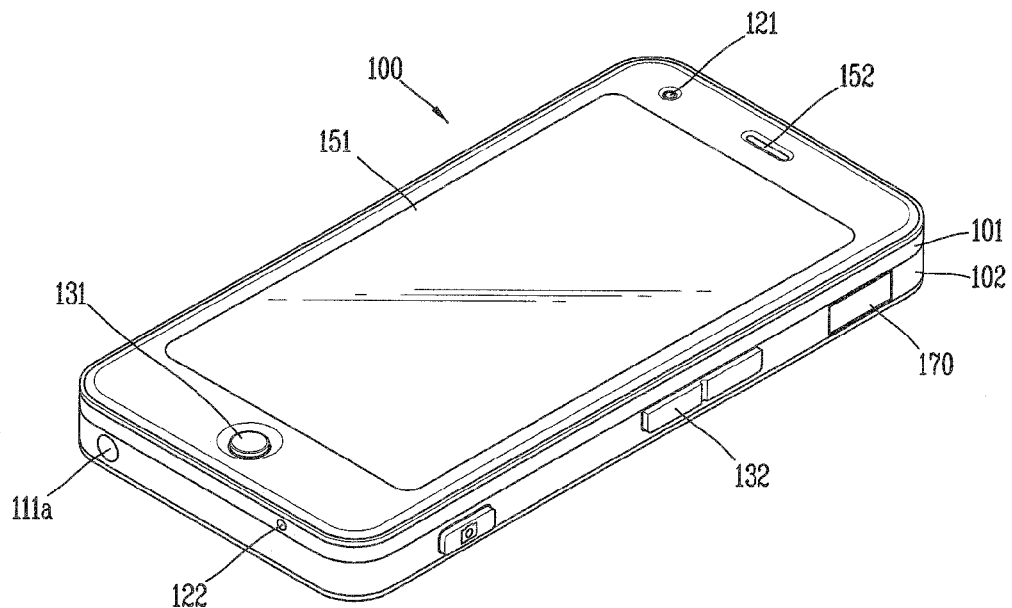
FIG. 2 is a front perspective view of a mobile terminal according to one embodiment of the present invention.

FIG. 2 is a front perspective view of the mobile terminal 100 according to the present invention.

The mobile terminal 100 is provided with a bar type terminal body. However, the present invention may not be limited to this bar type of mobile terminal, but may be applied to various types such as a slide type where two or more bodies are coupled to each other so as to perform a relative motion, a folder type, a swing type, a swivel type, etc.

The appearance of the mobile terminal 100 is implemented by a case (casing, housing, cover, etc.). The case may be formed by a front case 101 and a rear case 102. Each type of electronic components are mounted to a space formed by the front case 101 and the rear case 102. One or more intermediate cases may be provided between the front case 101 and the rear case 102.

The cases may be formed by injection-molding synthetic resin, or formed using metallic material such as stainless steel (STS), aluminum (Al) and titanium (Ti).

At the terminal body, may be disposed the display unit 151, an audio output unit 152, a camera 121, user input units 130/131, 132, the microphone 122, the interface unit 170, etc.

The display unit 151 may be disposed to occupy most parts of a main surface of the front case 101. On a region adjacent to one end of the display unit 151, disposed are the audio output module 152 and the camera 121. On a region adjacent to another end of the display unit 151, disposed are the user input unit 131 and the microphone 122. The user input unit 132, the interface unit 170, etc. may be disposed on side surfaces of the front case 101 and the rear case 102.

The user input unit 130 is manipulated to receive a command for controlling the operation of the mobile terminal 100, and may include a plurality of manipulation units 131 and 132. The manipulation units 131 and 132 may be referred to as manipulating portions, and may include any type of ones that can be manipulated in a user's tactile manner.

The first and second manipulation units 131 and 132 may be set to receive inputs in various manners. For instance, the first manipulation unit 131 may be configured to input commands such as START, END, and SCROLL, and the second manipulation unit 132 may be configured to input commands such as controlling a volume of a sound outputted from the audio output module 152, or converting a mode of the display unit 151 into a touch recognition mode.

Figure 3:
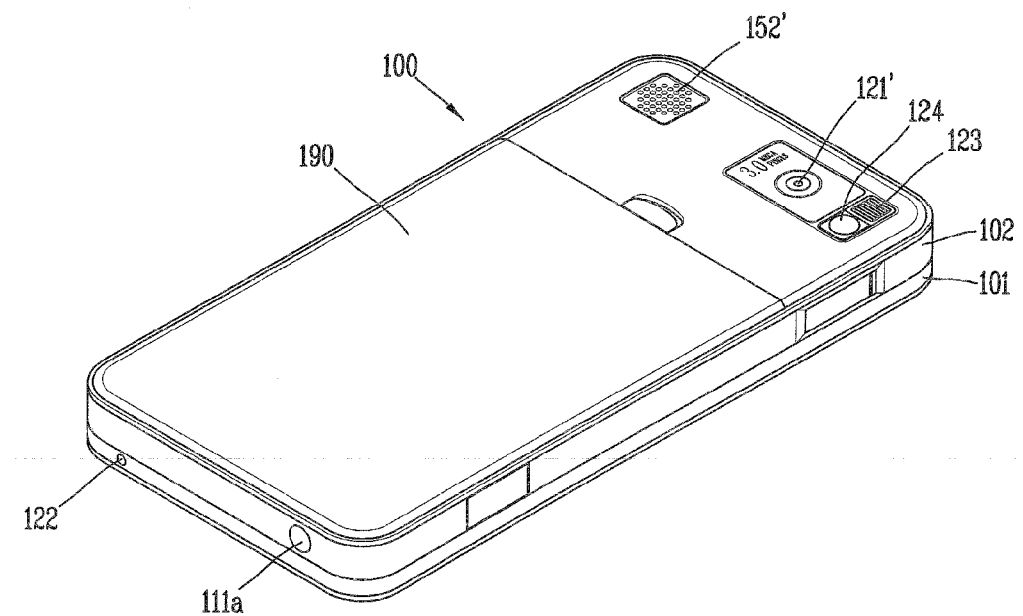
FIG. 3 is a rear perspective view of the mobile terminal of FIG. 2.

FIG. 3 is a rear perspective view of the mobile terminal 100 of FIG. 2.

Referring to FIG. 3, a camera 121' may be additionally mounted to a rear surface of the terminal body, i.e., the rear case 102. The camera 121' faces a direction which is opposite to a direction faced by the camera 121 (refer to FIG. 2), and may have pixels different from those of the camera 121.

For example, the camera 121 may operate with relatively lower pixels (lower resolution). Thus, the camera 121 may be useful when a user can capture his or her face and send it to a calling party in a video call mode or the like. On the other hand, the camera 121' may operate with a relatively higher pixels (higher resolution) such that it can be useful for a user to obtain higher quality pictures for later use. The cameras 121 and 121' may be installed at the terminal body so as to be rotated or popped-up.

A flash 123 and a mirror 124 may be additionally disposed adjacently to the camera 121'. When capturing an object by using the camera 121', the flash 123 provides light to the object. The mirror 124 can cooperate with the camera 121' to allow a user to photograph himself or herself in a self-portrait mode.

An audio output unit 152' may be additionally disposed on the rear surface of the terminal body. The audio output module 152' may implement a stereo function together with the audio output module 152 (refer to FIG. 2), and may be used for calling in a speakerphone mode.

A broadcast signal-receiving antenna 111a as well as an antenna for calling may be disposed on a side surface of the terminal body. The broadcast signal receiving antenna 111a of the broadcast receiving module 111 (refer to FIG. 1) may be configured to retract into the terminal body.

The power supply unit 190 for supplying power to the mobile terminal 100 is mounted to the terminal body. The power supply unit 190 may be mounted in the terminal body, or may be detachably mounted to an outer surface of the terminal body.

Figure 4:
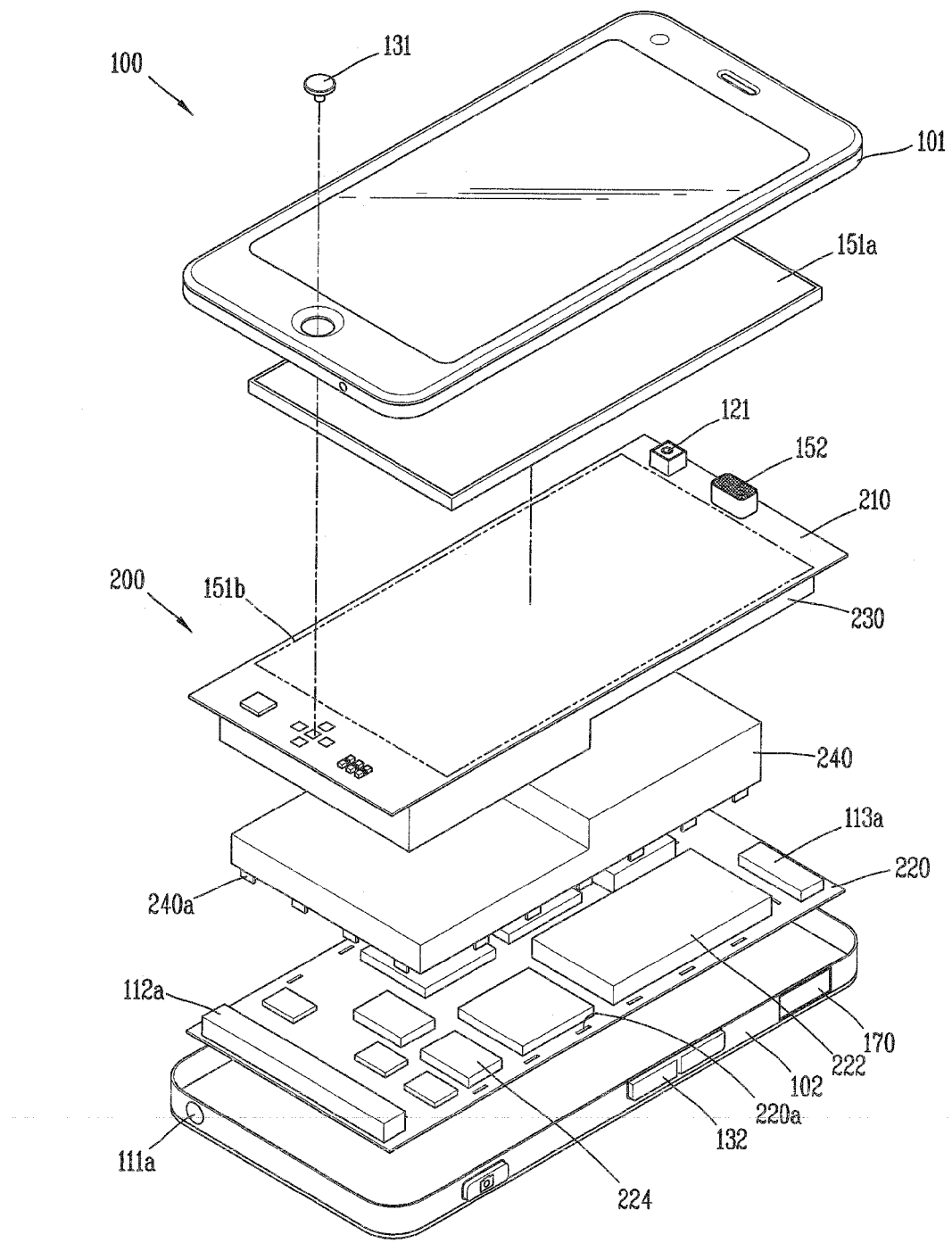
FIG. 4 is an exploded perspective view of the mobile terminal of FIG. 2.

FIG. 4 is an exploded perspective view of the mobile terminal 100 of FIG. 2, which illustrates a printed circuit board (PCB) 200 where each type of electronic devices are disposed.

Referring to FIG. 4, the PCB assembly 200 is disposed at an inner space of the terminal body. The PCB assembly 200 may be mounted to the front case 101 or the rear case 102, and may be disposed to occupy a majority of a main surface of the terminal body.

The PCB assembly 200 forms a space where each type of electronic devices are mounted. As shown, the audio output module 152, the camera 121, etc. may be mounted to the PCB assembly 200. The display 151a electrically connected to the PCB assembly 200 may be mounted to a specific region 151b on one surface of the PCB assembly 200.

The PCB assembly 200 may be configured as one example of the controller 180 (refer to FIG. 1) which controls the mobile terminal 100 so as to operate each type of functions of the mobile terminal 100. For instance, the PCB assembly 200 may be configured to display (output), on the display 151a, information processed by the mobile terminal 100.

Hereinafter, will be explained the PCB assembly 200 of a high intensity where electronic devices are integrated with each other for a slim configuration of the mobile terminal 100.

Figure 5:
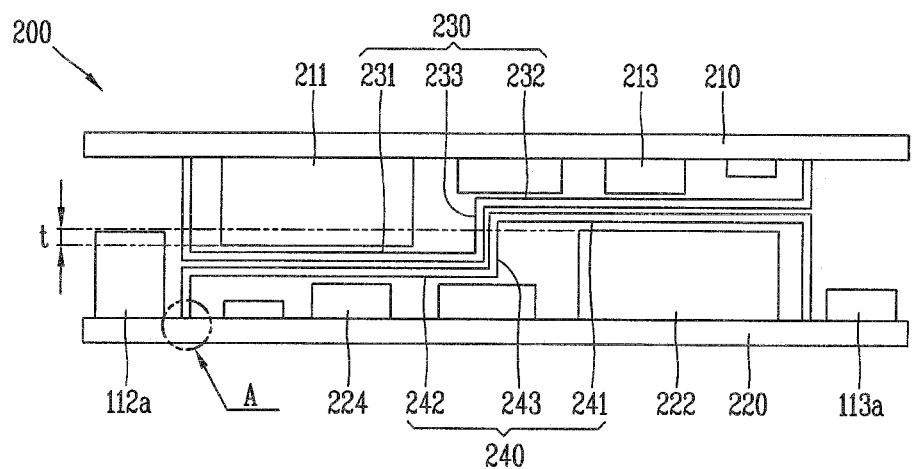
FIG. 5 is a sectional view of a printed circuit board (PCB) assembly of FIG. 4.

FIG. 5 is a sectional view of the PCB assembly of FIG. 4.

Referring to FIGS. 4 and 5, the PCB assembly 200 is disposed at an inner space defined by the front case 101 and the rear case 102. The PCB assembly 200 includes a first PCB 210 and a second PCB 220 to form a space where each type of electronic devices are mounted.

The first and second PCBs 210 and 220 are provided with an insulating board and a circuit pattern. The insulating board forms the appearance of the first and second PCBs 210 and 220, and serves as a basic member for providing the durability. The insulating board having an electric insulating property may be formed of epoxy resin, BT (Bismaleimide Triazine) resin, Aramid resin, etc.

Circuit patterns which constitute a circuit may be formed on one surface of the insulating board. For instance, the circuit patterns may be formed by depositing a dry film on an insulating board having a copper thin film coated thereon, followed by performing exposing, developing and etching processes with respect to the dry film according to a predetermined pattern. Alternatively, the circuit patterns may be formed by pressing a preset pattern on an insulating board of a semi-hardened state with a press, etc.

On the first PCB 210, each type of electronic device (e.g., a third electronic device 213) is mounted including a first electronic device 211. The first electronic device 211 has a greater thickness than other electronic devices mounted on the first PCB 210, such as a third electronic device 213. The electronic device may be mounted not only on one surface of the first PCB 210, but also another surface of the first PCB 210. As shown, the first electronic device 211 may be mounted on a surface of the first PCB 210 facing the second PCB 220, and the display 151a may be mounted on an opposite surface.

The second PCB 220 is disposed to face the first electronic device 211, and is provided with a second electronic device 222 on a surface facing the first PCB 210. The second PCB 220 may include other electronic devices (e.g., fourth electronic device 224) having a lesser thickness than the second electronic device 222. An electronic device may be mounted on a surface of the second PCB 220 facing the first PCB 210. For instance, a battery, an example of the power supply unit 190 may be detachably mounted to the terminal body, and may be electrically connected to the second PCB 220.

The fourth electronic device 224 may be disposed above the first electronic device 211, i.e., at a space between the first electronic device 211 and the second PCB 220. Here, no component may be mounted to the space between the first electronic device 211 and the second PCB 220. More concretely, the first electronic device 211 may be disposed to face the fourth electronic device 224 which is thinner than the second electronic device 222. Likewise, the second electronic device 222 may be disposed to cover the third electronic device 213 which is thinner than the first electronic device 211.

The first electronic device 211 is disposed to overlap the second electronic device 222 in a direction perpendicular to a thickness direction of the first electronic device 211 in a space between the first PCB 210 and the second PCB 220. That is, the first electronic device 211 and the second electronic device 222 are offset from one another. And, an upper surface of one electronic device protrudes from a surface of another electronic device by a predetermined length (t) toward one facing PCB.

Under this configuration, a thick electronic device and a thin electronic device are disposed to face each other in the space between the first PCB 210 and the second PCB 220. This allows the space above a thin electronic device to be utilized. Accordingly, there may be provided the PCB assembly 200 of a high intensity where electronic devices are integrated to one another.

Furthermore, since an empty space is utilized or minimized, the gap between the first PCB 210 and the second PCB 220 may be decreased. This may allow the mobile terminal 100 to have a slim configuration.

First and second antennas 112a and 113a configured to transmit and receive electromagnetic waves for wireless communications may be disposed at a space between the first and second PCBs 210 and 220. The first antenna 112a may be disposed at one end of the terminal body, and may serve as an antenna relating to the mobile communication module 112. The second antenna 113a may be disposed at another end of the terminal body in order to minimize interference with the first antenna 112a, and may serve as an antenna relating to the wireless internet module 113, e.g., a Wi-Fi antenna.

The PCB assembly may further include a first shield can 230 and/or a second shield can 240. The first and second shield cans 230 and 240 are configured to minimize interference between electronic devices disposed at regions separated from each other by the first and second shield cans 230 and 240. The first and second shield cans 230 and 240 may be formed of a metallic material, or may be formed by laminating a metallic material on a specific member.

The first shield can 230 is mounted on the first PCB 210 so as to cover the first electronic device 211, and is configured to shield EMI between the first electronic device 211 and the outside. The first electronic device 211 may be a component influenced by an electromagnetic wave occurring outside, or a component influencing on another component. For instance, the first electronic device 211 may be a main chip influenced by an electromagnetic wave occurring from the first antenna or the second electronic device 222.

The first shield can 230 may extend from a part which covers the first electronic device 211, and may be formed to have stair-steps so as to cover the third electronic device 213. More concretely, the first shield can 230 may consist of a first part 231 to cover the first electronic device 211, a second part 232 to cover the third electronic device 213, and a third part 233 to connect the first part 231 and the second part 232 to each other. The first part 231 and the second part 232 have different heights with respect to the first PCB 210 due to the first and second electronic devices 211 and 222 being disposed to overlap each other. The second electronic device 222 may be formed to protrude more toward the first PCB 210 than toward the first part 231.

The second electronic device 222 requires no additional shield can unless it is influenced by an electromagnetic wave or it influences on another electronic device. However, in case of shielding EMI like the first electronic device 211, the second PCB 220 may be provided with the second shield can 240 to cover the second electronic device 222.

The second shield can 240 may have the same configuration, arrangement and function as the first shield can 230. The second shield can 240 may be formed in stair-steps so as to extend from a first part 241 which covers the second electronic device 222, a second part covering the fourth electronic device 224, and a third part 243 connecting the first part and the second part.

The first shield can 230 and the second shield can 240 may be spaced from each other with a preset gap therebetween. This is in order to prevent one shield can from contacting the other shield can when an external impact occurs.

Figure 6:
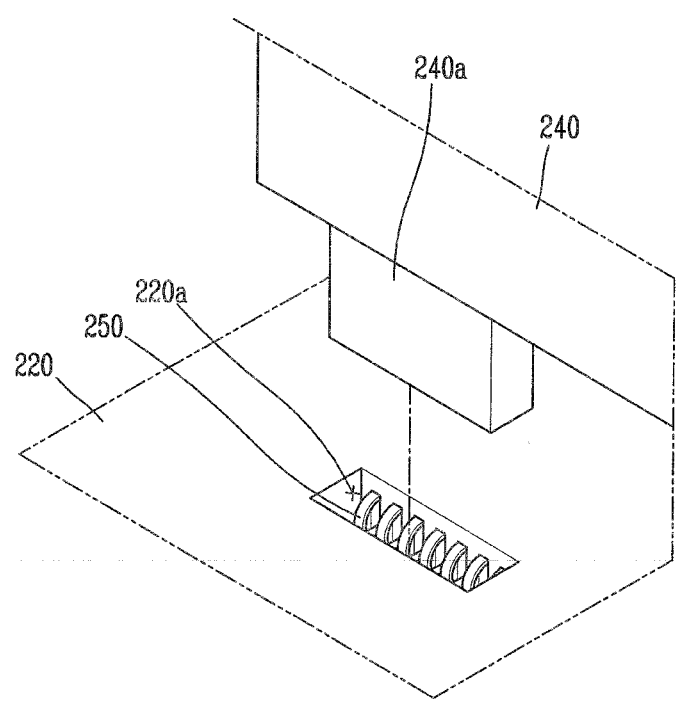
FIG. 6 is an exploded perspective view of a second shield can and an elastic coupling portion of FIG. 4.
Figure 7:
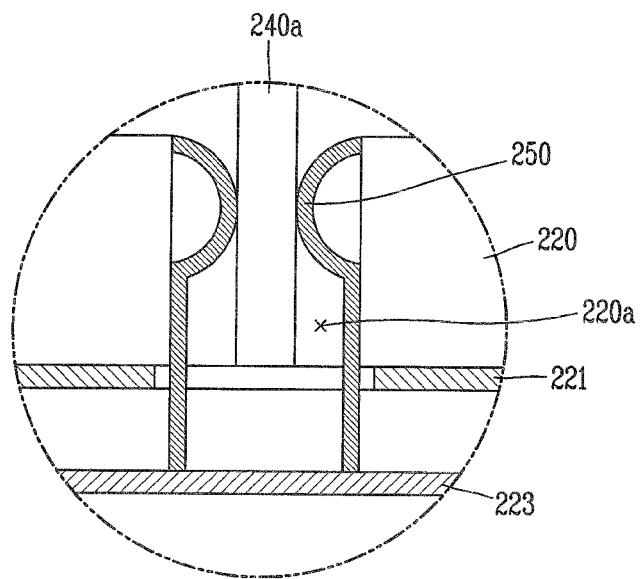
FIG. 7 is an enlarged sectional view of part 'A' of FIG. 5.

FIG. 6 is an exploded perspective view of the second shield can 240 and an elastic coupling portion of FIG. 4, and FIG. 7 is an enlarged sectional view of part 'A' of FIG. 5. The following structure may be applied not only to a coupling structure between the second shield can 240 and the second PCB 220, but also to a coupling structure between the first shield can 230 and the first PCB 210.

The second shield can 240 may be mounted to the second PCB 220 by a Surface Mount Technology (SMT), or may be detachably coupled to the second PCB 220. The process for mounting the second shield can 240 to the second PCB 220 will be explained as follows. Firstly, lead is patterned on the second PCB 220, and the second and fourth electronic devices 222 and 224 and the second shield can 240 which covers the second and fourth electronic devices 222 and 224 are disposed on the lead using mounting equipment. Then, the second PCB 220 having the components thereon is made to pass through a reflow oven such that the components are electrically connected to the second PCB 220 by soldering.

A structure to detachably couple the second shield can 240 to the second PCB 220 will be explained with reference to FIGS. 6 and 7. The second PCB 220 is provided with a fixing recess 220a where the second shield can 240 is to be mounted. The fixing recess 220a may be disposed at a plurality of positions with a predetermined gap therebetween, and may be configured to accommodate a protrusion 240a therein.

The protrusion 240a inserted into the fixing recess 220a is formed at the end of the second shield can 240. The protrusion 240a may be formed in plurality in correspondence to the fixing recesses 220a, and the plurality of protrusions 240a may be spaced from each other.

An elastic coupling portion 250, configured to accommodate and elastically press the protrusion 240a, is included in the fixing recess 220a. For instance, the elastic coupling portion 250 may be implemented as an elastic contact clip protruding from two facing surfaces of the fixing recess 220a. The elastic contact clip serves to fix the second shield can 240 to the second PCB 220 by elastically pressing the protrusion 240a.

The elastic coupling portion 250 may be electrically connected to the second PCB 220 so that the second shield can 240 may be grounded. More concretely, the second PCB 220 is provided with a signal portion 221 for signal connection, and a ground portion 223 for grounding. The elastic coupling portion 250 may be electrically connected to the ground portion 223 so that the second shield can 240 may be grounded when coupled to the second PCB 220.

Figure 8:
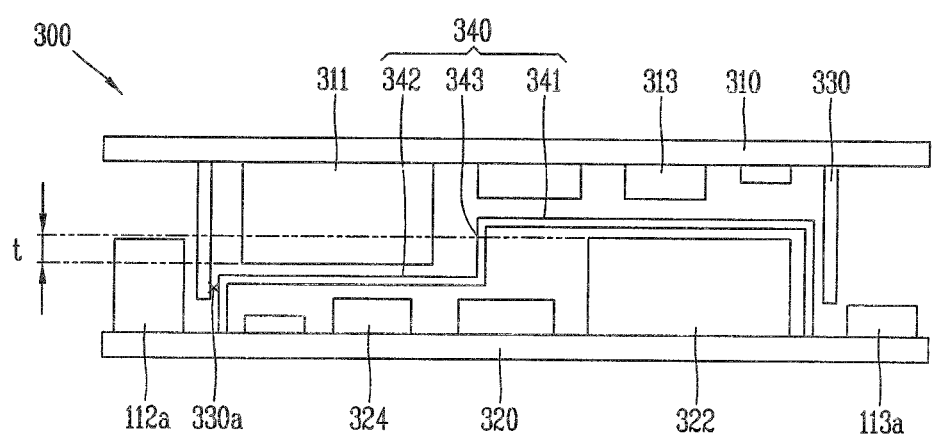
FIG. 8 is a sectional view illustrating another embodiment of the printed circuit board (PCB) assembly of FIG. 4.

FIG. 8 is a sectional view illustrating another embodiment of the PCB assembly 200 of FIG. 4.

Referring to FIG. 8, a PCB assembly 300 has the same configuration as the aforementioned PCB assembly 200 except for a shield can 340 mounted to one printed circuit board, and a shield wall 330 mounted to another printed circuit board. Like in the aforementioned embodiment, a first electronic device 311 is disposed to overlap a second electronic device 322 in a direction perpendicular to a thickness direction of the first electronic device 311 at a space between the first and second PCBs 310 and 320.

Hereinafter, will be explained a structure to mount the shield wall 330 to the first PCB 310, and a structure to mount the shield can 340 to the second PCB 320.

The shield wall 330, configured to encompass the first electronic device 311 and/or a third electronic device 313, is disposed on the first PCB 310. And, the shield can 340 configured to cover the second electronic device 322 and/or a fourth electronic device 324 is disposed on the second PCB 320.

As opposed to the shield can 340, the shield wall 330 is implemented in the form of a cavity having no upper surface. The shield wall 330 is configured to shield EMI between the first and/or third electronic devices 311, 313 accommodated therein and the outside. Like the aforementioned first and second shield cans 230 and 240, the shield wall 330 may be formed of a metallic material, or may be formed by laminating a metallic material on a specific member.

The shield wall 330 may be spaced, by a preset distance, from a surface of the shield can 340. Here, the space between the shield wall 330 and the shield can 340 may serve as a radiating portion 330a. For instance, the shield wall 330 may be disposed on an upper surface of the shield can 340. Alternatively, as shown, the shield wall 330 may be configured to encompass side surfaces of the shield can 340.

The radiating portion 330a formed between the shield wall 330 and the shield can 340 is configured to radiate heat generated from the first electronic device 311 and/or the third electronic device 313 to the outside. The radiating portion 330a is configured to have an area less than a maximum allowable area to shield EMI.

As opposed to the aforementioned structure in which the first and second shield cans 230 and 240 face each other with a preset gap therebetween, this embodiment is implemented such that a space between the first and second PCBs 310 and 320 may be reduced by a thickness of one shield can and a gap between the shield cans. This may allow the mobile terminal 100 to have a slim configuration.

Furthermore, since the space between the shield wall 330 and the shield can 340 serves as the radiating portion 330a, EMI may be effectively shielded and a radiating performance may be enhanced.

Figure 9:
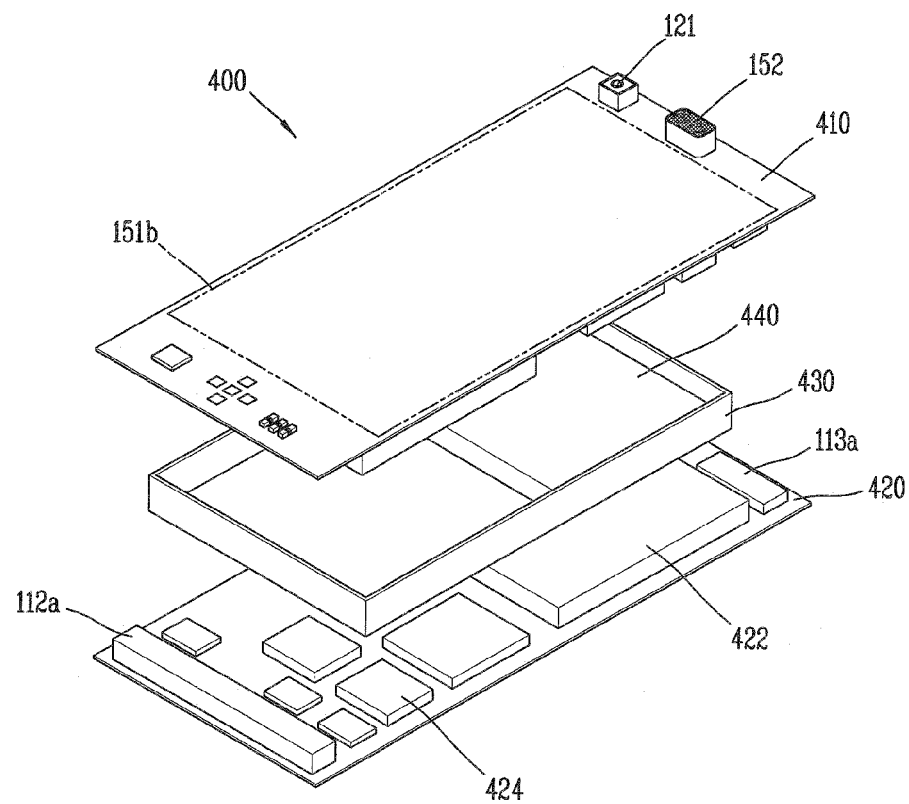
FIG. 9 is an exploded perspective view illustrating another embodiment of the printed circuit board (PCB) assembly of FIG. 4.
Figure 10:
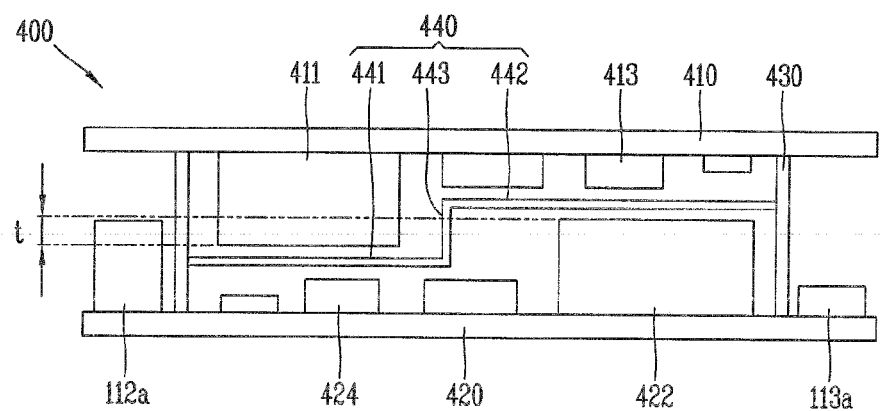
FIG. 10 is a sectional view of the PCB assembly of FIG. 9.

FIG. 9 is an exploded perspective view illustrating another embodiment of the printed circuit board (PCB) assembly 200 of FIG. 4, and FIG. 10 is a sectional view of the PCB assembly 400 of FIG. 9.

Referring to FIGS. 9 and 10, the PCB assembly 400 has the same configuration as the aforementioned PCB assemblies 200 and 300 except for a shield block 430 and a shield layer 440. Like in the aforementioned embodiments, a first electronic device 411 is disposed to overlap a second electronic device 422 in a direction perpendicular to a thickness direction of the first electronic device 411 at a space between first and second PCBs 410 and 420.

Hereinafter, a structure of an integrated shield consisting of a shield block 430 and a shield layer 440 will be explained. The shield block 430 configured to encompass first to fourth electronic devices 411, 422, 413 and 424 is disposed at a space between the first and second PCBs 410 and 420. The shield block 430 is configured to shield EMI between an internal region where the first to fourth electronic devices 411, 422, 413 and 424 are disposed, and an external region. Like the aforementioned shield cans 230, 240, 340 and the shield wall 330, the shield block 430 may be formed of a metallic material, or may be formed by laminating a metallic material on a specific member.

For instance, the shield block 430 may be configured to shield interference between the first antenna 112a and the first and fourth electronic devices 411, 424, and/or between the second antenna 113a and the second and third electronic devices 422, 413. A radiating hole may be formed at a specific part of the shield block 430. This radiating hole may be formed at a position spaced from electronic components as far as possible, for prevention of EMI.

Inside the shield block 430, may be disposed the shield layer 440 configured to separate a region of the first and third electronic devices 411 and 413, from a region of the second and fourth electronic devices 422 and 424. The shield layer 440 is configured to shield EMI between the first and third electric devices 411 and 413, and the second and fourth electronic devices 422 and 424.

Like the aforementioned shield cans 230, 240 and 340, the shield layer 440 may be formed to have stair steps. More concretely, the shield layer 440 includes first to third shield layers 441, 442 and 443. The first shield layer 441 is disposed between the first electronic device 411 and the fourth electronic device 424 so as to cover an upper surface of the first electronic device 411. The second shield layer 442 is disposed between the second electronic device 422 and the third electronic device 413 so as to cover an upper surface of the second electronic device 422. The first and second shield layers 441 and 442 have different heights based on one of the first and second PCBs 410 and 420 due to overlapping between the first and second electronic devices 411 and 422. The third shield layer 443 is configured to connect the first and second shield layers 441 and 442 to each other.

The shield block 430 and the shield layer 440 may be integrally formed with each other. For instance, the shield block 430 and the shield layer 440 may be integrally formed as one metallic member through a plurality of press processes. Alternatively, the shield block 430 and the shield layer 440 may be integrally formed with each other by welding, etc.

Through the integrated shield structure of the shield block 430 and the shield layer 440, a gap between the first and second shield cans 230 and 240 covering the first and second PCBs 410 and 420. In addition, fabrication procedures may be simplified.

Furthermore, since empty space is utilized or minimized, the gap between the first and second PCBs 410 and 420 may be decreased. This may allow the mobile terminal 100 to have a slim configuration.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal, comprising:
    a terminal body; and
    a printed circuit board (PCB) assembly mounted to the terminal body, wherein the PCB assembly includes:
        a first PCB;
        a first electronic device mounted on the first PCB;
        a second PCB spaced from the first PCB in a first direction; and
        a second electronic device mounted on the second PCB;
        a shield wall protruding from the first PCB toward the second PCB to encompass the first electronic device, and configured to shield Electro Magnetic Interference (EMI) between the first electronic device and the outside; and
        a shield can mounted on the second PCB so as to cover the second electronic device, and configured to shield Electro Magnetic Interference (EMI) between the second electronic device and the outside,
    wherein the first electronic device is disposed to overlap the second electronic device in a direction perpendicular to the first direction,
    wherein the shield wall is configured to encompass side surfaces of the shield can and is spaced from the side surfaces of the shield can by a preset gap so as to form a radiating portion, the radiating portion being configured to radiate heat generated from the first electronic device to the outside,
    wherein first and second antennas are disposed to be adjacent to the first and second electronic devices, respectively, in a state that the shield wall is interposed therebetween, and configured to transmit and receive electromagnetic waves for wireless communications, and
    wherein the shield wall and shield can are disposed between the first antenna and the second antenna to at least partially overlap each other in the direction perpendicular to the first direction, so as to shield interference between the first antenna and the second antenna.

2. The mobile terminal of claim 1, wherein a third electronic device is mounted on the first PCB so as to face the second electronic device.

3. The mobile terminal of claim 1, wherein a fourth electronic device is mounted on the second PCB so as to face the first electronic device.

4. The mobile terminal of claim 3, wherein the shield can has stair-steps so as to cover the fourth electronic device.

5. The mobile terminal of claim 1, further comprising an elastic coupling portion on the second PCB and disposed along a circumference of the shield can, and configured to accommodate and elastically press the shield can such that the shield can block is fixed.

6. The mobile terminal of claim 5, wherein the elastic coupling portion is electrically connected to the second PCB such that the shield can is grounded.

* * * * *